United States Patent
Tachibana et al.

(10) Patent No.: US 9,957,610 B2
(45) Date of Patent: May 1, 2018

(54) HIGH-FREQUENCY WAVE SUPPLYING STRUCTURE

(71) Applicant: TOYOTA JIDOSHA KABUSHIKI KAISHA, Toyota-shi (JP)

(72) Inventors: Kazutaka Tachibana, Nagoya (JP); Takayasu Sato, Takahama (JP); Yoji Sato, Kasugai (JP); Hiromichi Nakata, Toyota (JP); Daiki Tsuboi, Nishikasugai (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days. days.

(21) Appl. No.: 15/647,305

(22) Filed: Jul. 12, 2017

(65) Prior Publication Data

US 2018/0030594 A1 Feb. 1, 2018

(30) Foreign Application Priority Data

Jul. 27, 2016 (JP) .................................. 2016-147261

(51) Int. Cl.
*H05H 1/46* (2006.01)
*C23C 16/27* (2006.01)
(Continued)

(52) U.S. Cl.
CPC ........ *C23C 16/274* (2013.01); *C23C 16/4581* (2013.01); *C23C 16/511* (2013.01);
(Continued)

(58) Field of Classification Search
CPC ... C23C 16/274; C23C 16/511; C23C 16/458; C23C 16/4581; H05H 1/46; H01L 21/205; H01J 37/32
See application file for complete search history.

(56) References Cited

U.S. PATENT DOCUMENTS 5,234,529 A * 8/1993 Johnson ............ H01J 37/32082
118/723 I
6,312,555 B1 * 11/2001 Daviet ................. H01J 37/321
118/723 I
(Continued)

FOREIGN PATENT DOCUMENTS

JP 7-243035 9/1995
JP 2006-83405 3/2006
(Continued)

*Primary Examiner* — Thai Pham
(74) *Attorney, Agent, or Firm* — Oblon, McClelland, Maier & Neustadt, L.L.P.

(57) ABSTRACT

A high-frequency wave supplying structure includes a center conductor that extends in a specified direction, an outer conductor that is coaxial with the center conductor and grounded, and a cylindrical insulating member that is provided between the center conductor and the outer conductor. The distal end of the center conductor is a support portion that supports a workpiece W. A shield member is provided outward of the outer conductor to be coaxial with the outer conductor and the center conductor. The distal end of the shield member is located closer to the support portion in the specified direction than the distal end of the outer conductor. The insulating member includes a protruding portion that protrudes toward the support portion from an opening of the outer conductor. The protruding portion is opposed to the distal end of the outer conductor in the specified direction.

6 Claims, 4 Drawing Sheets

(51) Int. Cl.
*C23C 16/511* (2006.01)
*C23C 16/458* (2006.01)
*H01L 21/205* (2006.01)

(52) U.S. Cl.
CPC ............ *H01L 21/205* (2013.01); *H05H 1/46* (2013.01); *H05H 2001/4607* (2013.01)

(56) References Cited

U.S. PATENT DOCUMENTS 8,294,382 B2 * 10/2012 DeVincentis ......... H01J 65/044
 313/231.31
2002/0023589 A1 * 2/2002 Kondo .............. H01J 37/32082
 118/723 ER

FOREIGN PATENT DOCUMENTS

| JP | 4649153 | 3/2011 |
| JP | 5668637 | 2/2015 |
| JP | 2015-101777 | 6/2015 |

* cited by examiner

HIGH-FREQUENCY WAVE SUPPLYING STRUCTURE

BACKGROUND OF THE INVENTION

The present invention relates to a high-frequency wave supplying structure for supplying a high-frequency wave such as a microwave to a workpiece placed in a chamber.

Japanese Laid-Open Patent Publication No. 07-243035 discloses a film forming apparatus capable of performing, in a single chamber, a first process for depositing a metal film on a workpiece and a second process for forming a film on the workpiece by supplying high-frequency waves such as microwaves to the chamber.

Japanese Laid-Open Patent Publication No. 2006-83405 discloses a high-frequency wave supplying structure that supplies a microwave, which is an example of high-frequency wave, to a workpiece in a chamber. As shown in FIG. 7, the high-frequency wave supplying structure described in this publication includes a center conductor 101, which extends in a specified direction, a tubular outer conductor 102, which is arranged outward of the center conductor 101 and coaxial with the center conductor 101, and a cylindrical insulating member 103, which is arranged between the outer conductor 102 and the center conductor 101. The center conductor 101 protrudes from the opening of the outer conductor 102 located in the chamber 110. At the distal end of the center conductor 101, a support portion 104 for supporting a workpiece 150 is provided.

When a microwave is supplied to the center conductor 101, the microwave flows toward the support portion 104 through between the center conductor 101 and the outer conductor 102, that is, through the insulating member 103, as indicated by arrows in FIG. 7. The microwave is thus supplied to the workpiece 150. Then, in the vicinity of the workpiece 150 in the chamber 110, the microwave turns the process gas supplied to the chamber 110 into plasma to decompose the gas. The decomposed process gas adheres to the workpiece 150 so that a film made of the gas is formed on the workpiece 150.

When the first process is performed in the chamber of the film forming apparatus described in Japanese Laid-Open Patent Publication No. 07-243035, metal adheres not only to the workpiece but also to wall surfaces of the chamber and components in the chamber. For this reason, when employing the high-frequency wave supplying structure of Japanese Laid-Open Patent Publication No. 2006-83405 in the film forming apparatus of Japanese Laid-Open Patent Publication No. 07-243035, metal 160 adheres to a portion of the high-frequency wave supplying structure that is located in the chamber 110, and the metal 160 may connect the center conductor 101 to the outer conductor 102. In this case, if the outer conductor 102 is grounded, the high-frequency wave supplied to the workpiece 150 by the high-frequency wave supplying structure leaks to the outer conductor 102 via the metal 160. This hinders supply of the high-frequency wave to the workpiece 150.

SUMMARY OF THE INVENTION

It is an objective of the present invention to provide a high-frequency wave supplying structure capable of restraining supply of a high-frequency wave to a workpiece from being hindered.

To achieve the foregoing objective and in accordance with one aspect of the present invention, a high-frequency wave supplying structure is provided. The structure is employed in a film forming apparatus that performs, in a single chamber, a process of forming a metal film on a workpiece and a process using a high-frequency wave on a workpiece. The structure includes a center conductor that extends in a specified direction and to which a high-frequency wave is supplied, an outer conductor that is located outward of the center conductor, coaxial with the center conductor, and grounded, a cylindrical insulating member that is provided between the center conductor and the outer conductor. The center conductor includes a distal end that protrudes in the specified direction from an opening of the outer conductor. The distal end of the center conductor is a support portion that supports the workpiece. A tubular shield member is arranged outward of the outer conductor to be coaxial with the outer conductor and the center conductor. The shield member includes a distal end that is located at an end in a vicinity of the support portion in the specified direction. The outer conductor includes a distal end that is located at an end in a vicinity of the support portion in the specified direction. The distal end of the shield member is closer to the support portion in the specified direction than the distal end of the outer conductor. The insulating member includes a protruding portion that protrudes in the specified direction toward the support portion from the opening of the outer conductor. At least one of the protruding portion and the shield member is opposed to the distal end of the outer conductor in the specified direction.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE PREFERRED EMBODIMENTS

A high-frequency wave supplying structure according to one embodiment of the present invention will now be described with reference to FIGS. 1 and 2.

Figure 1:
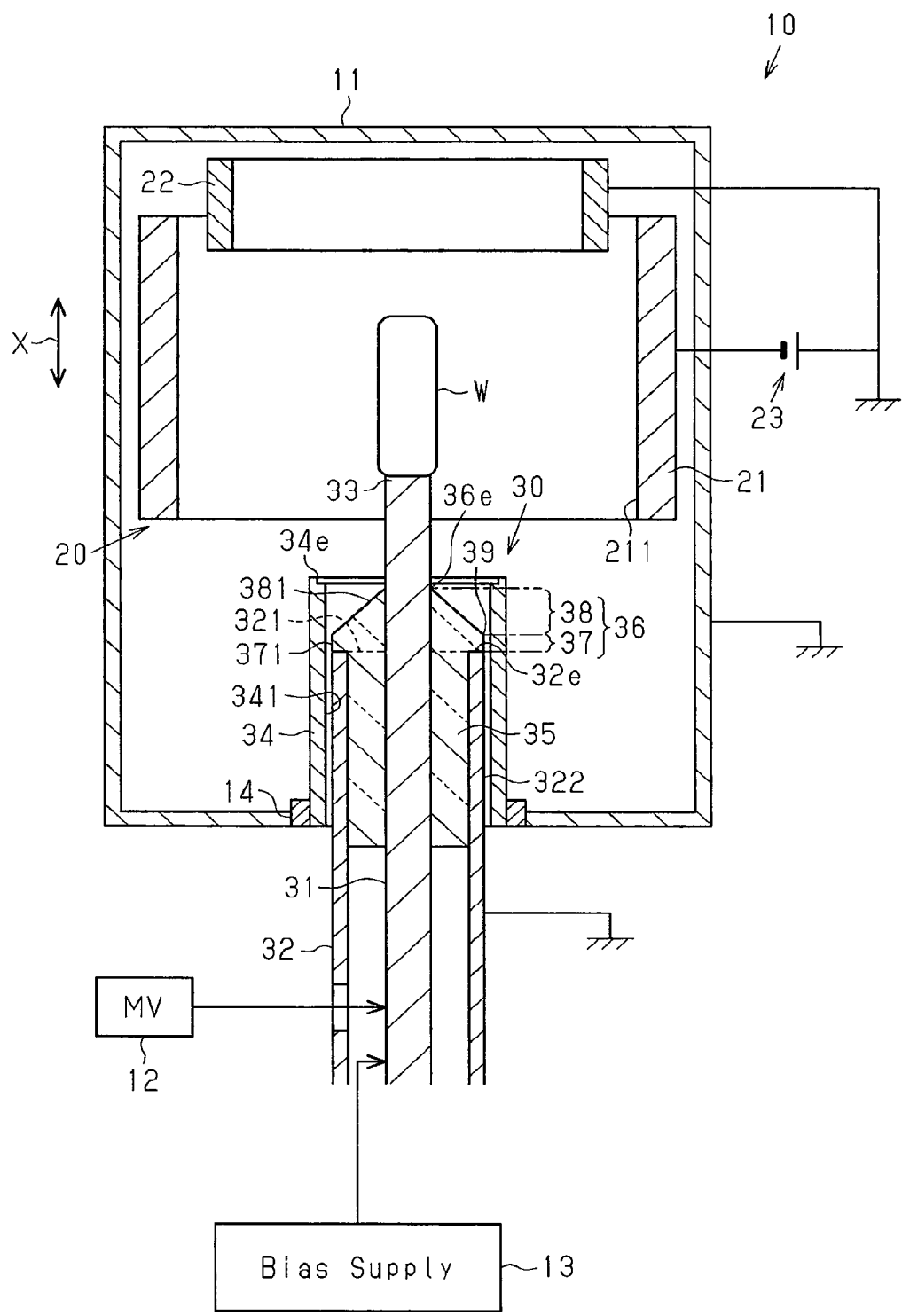
FIG. 1 is a cross-sectional view schematically showing the structure of a film forming apparatus having a high-frequency wave supplying structure according to one embodiment of the present invention.

As shown in FIG. 1, a film forming apparatus 10 includes a high-frequency wave supplying structure 30 and a chamber 11, in which vacuum atmosphere is created. The film forming apparatus 10 performs a first process of forming a metal film such as a titanium film on a workpiece W arranged in the chamber 11 and a second process of forming another film on the workpiece W, on which the metal film has been formed, by using a microwave.

The film forming apparatus 10 also includes an arc discharge generator 20 for generating an arc discharge in the chamber 11 and a high-frequency wave output device 12 for supplying a microwave as an example of a high-frequency wave to the high-frequency wave supplying structure 30. The high-frequency wave supplying structure 30 supports the workpiece W in the chamber 11. The film forming apparatus 10 has a bias supply 13 for applying a negative bias voltage to the workpiece W via the high-frequency wave supplying structure 30.

The arc discharge generator 20 includes an evaporation source 21 made of metal such as titanium and an anode member 22 made of a conductive material such as aluminum. Both the evaporation source 21 and the anode member 22 have a cylindrical shape. The anode member 22 is arranged inward of and coaxially with the evaporation source 21. A power-supply device 23 applies negative DC voltage to the evaporation source 21. The anode member 22 is grounded. Therefore, when the power-supply device 23 is applying the negative DC voltage to the evaporation source 21, the evaporation source 21 functions as a cathode, and the anode member 22 functions as an anode. When a striker (not shown) is separated from the evaporation source 21 after being brought into contact with the evaporation source 21, arc discharge is generated between an inner circumferential surface 211 of the evaporation source 21 and the anode member 22. While the arc discharge continues, metal ions are released from the inner circumferential surface 211 of the evaporation source 21.

The high-frequency wave supplying structure 30 includes a center conductor 31 and a tubular outer conductor 32. The center conductor 31 extends in a specified direction X, which is the axial direction of the central axes of the evaporation source 21 and the anode member 22. The outer conductor 32 is located outward of the center conductor 31 and coaxial with the center conductor 31. The outer conductor 32 is grounded. An outer circumferential surface 322 of the outer conductor 32 is insulated. The center conductor 31 and the outer conductor 32 are inserted into the chamber 11 from the outside. One of the openings of the outer conductor 32 at the opposite ends is an opening 321 located in the chamber 11. The center conductor 31 protrudes in the specified direction X from the opening 321. Part of the center conductor 31 protrudes out of the outer conductor 32. The distal end of the protruding part is a support portion 33, which supports the workpiece W.

In addition, the high-frequency wave supplying structure 30 has a cylindrical shield member 34, which is arranged coaxially with both the center conductor 31 and the outer conductor 32. The shield member 34 is arranged outward of the outer conductor 32. The diameter of an inner circumferential surface 341 of the shield member 34 is larger than the diameter of an outer circumferential surface 322 of the outer conductor 32. The shield member 34 is thus not in contact with the outer conductor 32. The shield member 34 is made of a conductive material, but is not grounded. The shield member 34 is supported by the side wall of the chamber 11 with a sealing member 14 made of an insulating material.

The shield member 34 has a distal end 34e, which is an end in the vicinity of the support portion 33 in the specified direction X. The outer conductor 32 has a distal end 32e, which is an end in the vicinity of the support portion 33 in the specified direction X. The distal end 34e of the shield member 34 is closer to the support portion 33 than the distal end 32e of the outer conductor 32, and above the distal end 32e of the outer conductor 32 as viewed in the drawing.

A cylindrical insulating member 35 is provided between the center conductor 31 and the outer conductor 32. The insulating member 35 is made of an insulating material capable of transmitting microwaves. The insulating member 35 has a protruding portion 36 protruding in the specified direction X from the opening 321 of the outer conductor 32 toward the support portion 33.

As shown in FIG. 1, the protruding portion 36 has a proximal section 37 and a distal section 38, which is closer to the support portion 33 than the proximal section 37 in the specified direction X. The outer diameter of the proximal section 37 is larger than the inner diameter of the outer conductor 32. The outer circumferential surface of the proximal section 37 is parallel to the inner circumferential surface 341 of the shield member 34. Therefore, the outer diameter of the proximal section 37 is constant irrespective of the position in the specified direction X. The proximal section 37 is opposed to the distal end 32e of the outer conductor 32 in the specified direction X. The outer circumferential surface of the proximal section 37 is a proximal surface 371.

The outer diameter of the distal section 38 decreases toward the support portion 33 in the specified direction X. In other words, the outer circumferential surface of the distal section 38 approaches the center conductor 31 toward the support portion 33 in the specified direction X. The outer circumferential surface of the distal section 38 is a distal surface 381, which is arranged between the proximal surface 371 and the support portion 33 in the defined direction X. The distal section 38 has a distal end that is an end in the vicinity of the support portion 33 in the specified direction X. The distal end of the distal section 38 is a distal end 36e of the protruding portion 36. The distal end 36e of the protruding portion 36 is slightly farther from the support portion 33 in the specified direction X than the distal end 34e of the shield member 34. That is, the distal end 36e of the protruding portion 36 is located slightly lower than the distal end 34e of the shield member 34. The boundary between the proximal surface 371 and the distal surface 381 on the outer circumferential surface of the protruding portion 36 will hereafter be referred to as a boundary portion 39.

Next, the first process and the second process performed in the film forming apparatus 10 will be sequentially described.

First, the workpiece W is supported by the support portion 33 in the chamber 11. Then, the first process is started to form a metal film on the workpiece W. In the first process, a negative bias voltage output from the bias supply 13 is applied to the workpiece W via the center conductor 31. The power-supply device 23 applies a negative DC voltage to the evaporation source 21. In this state, when the striker is separated from the evaporation source 21 after being brought into contact with the evaporation source 21, arc discharge is generated between the evaporation source 21 and the anode member 22. While the arc discharge continues, metal ions released from the evaporation source 21 due to the arc discharge adhere to the workpiece W. As a result, a metal film is formed on the workpiece W.

Upon completion of the formation of the metal film on the workpiece W, the application of the negative DC voltage to the evaporation source 21 is ended, and the arc discharge is extinguished in the chamber 11. As a result, metal ions are no longer released from the evaporation source 21, and the first process is ended.

After the first process is completed, the second process is started. In the second process, process gas is supplied to the vicinity of the workpiece W in the chamber 11 together with inert gas such as argon. As the process gas, for example, hydrocarbon gas such as acetylene can be used.

In this state, a negative bias voltage output from the bias supply 13 is applied to the workpiece W via the center conductor 31. A microwave output from the high-frequency wave output device 12 is supplied to the center conductor 31. Then, in the high-frequency wave supplying structure 30, the microwave flows toward the support portion 33 through between the center conductor 31 and the outer conductor 32. The microwave is thus supplied to the workpiece W. Then, in the vicinity of the workpiece W in the chamber 11, the microwave turns the process gas supplied to the chamber 11 into plasma to decompose the gas. The decomposed process gas adheres to the workpiece W so that a film made of the gas (for example, a diamond-like carbon film) is formed on the workpiece W.

When the first process is performed, the metal resulting from the metal ions released from the evaporation source 21 is supplied not only to the workpiece W, but also to the surface of each part located in the chamber 11 of the high-frequency wave supplying structure 30 and to the side walls of the chamber 11.

Next, referring to FIG. 2, operation of the high-frequency wave supplying structure 30 will be described together with advantages.

Figure 2:
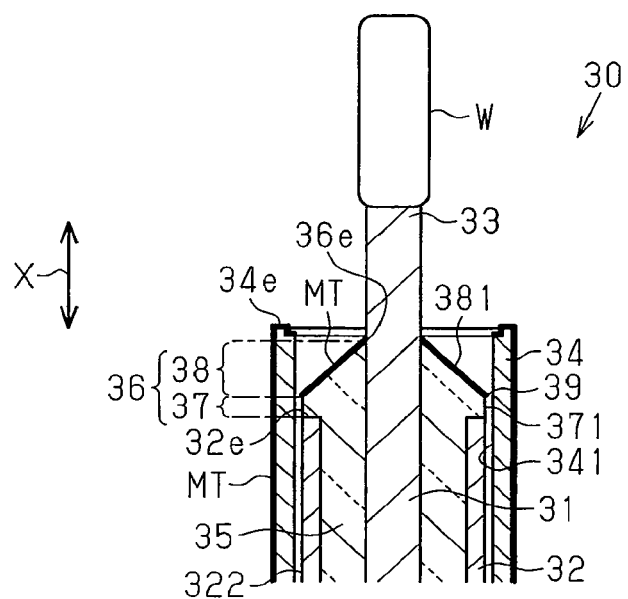
FIG. 2 is a cross-sectional view showing a state in which metal has adhered to the high-frequency wave supplying structure.

As shown in FIG. 2, the shield member 34, which is arranged outward of the outer conductor 32, restrains metal MT from adhering to the outer circumferential surface 322 of the outer conductor 32. The proximal section 37 of the protruding portion 36 is opposed to the distal end 32e of the outer conductor 32 in the specified direction X. Therefore, the section of the proximal section 37 that is opposed to the distal end 32e of the outer conductor 32 restrains the metal MT from adhering to the distal end 32e of the outer conductor 32. That is, the metal MT is restrained from adhering to the outer conductor 32. This restrains the center conductor 31 from being electrically connected to the outer conductor 32.

The gap between the distal surface 381 of the protruding portion 36 and the inner circumferential surface 341 of the shield member 34 is relatively wide. Thus, the metal MT adheres to the distal surface 381 in some cases. On the other hand, the gap between the proximal surface 371 of the protruding portion 36 and the inner circumferential surface 341 of the shield member 34 is significantly narrow. Specifically, in the radial direction from the central axis of the center conductor 31, the proximal surface 371 is arranged at the same position as the outer circumferential surface 322 of the outer conductor 32. The shield member 34 thus restrains metal from adhering to the proximal surface 371. As a result, even if metal MT adheres to the distal surface 381 of the protruding portion 36, the center conductor 31 is restrained from being electrically connected to the outer conductor 32 by the metal MT adhered to the high-frequency wave supplying structure 30.

If the position of the distal end 34e of the shield member 34 in the specified direction X is substantially the same as the position in the specified direction X of the boundary portion 39 between the proximal surface 371 and the distal surface 381 of the protruding portion 36 of the insulating member 35, the center conductor 31 is likely to be connected to the shield member 34 by the metal MT adhered to the high-frequency wave supplying structure 30. In this respect, in the high-frequency wave supplying structure 30 of the present embodiment, the position of the distal end 34e of the shield member 34 in the specified direction X is displaced from the position in the specified direction X of the boundary portion 39 as shown in FIG. 2. As a result, even if metal MT adheres to the distal surface 381 of the protruding portion 36 and the distal end 34e of the shield member 34, the metal MT is unlikely to connect the center conductor 31 to the shield member 34.

When the process of forming a metal film MT on the workpiece W is performed, the metal adhered to the high-frequency wave supplying structure 30 connects the center conductor 31 to the shield member 34 in some cases. At this time, if the shield member 34 were made of a conductive material and grounded, the center conductor 31 would be grounded via the metal MT and the shield member 34, and the microwave flowing toward the support portion 33 through the insulating member 35 between the center conductor 31 and the outer conductor 32 would leak to the shield member 34. In this respect, the shield member 34 of the present embodiment is made of a conductive material, but is not grounded. Thus, even if the center conductor 31 is connected to the shield member 34 by the metal MT adhered to the high-frequency wave supplying structure 30, the center conductor 31 is restrained from being grounded.

Therefore, when a microwave is supplied to the workpiece W in the second process under with metal MT adhered to the high-frequency wave supplying structure 30, prevention of electrical connection of the center conductor 31 to the outer conductor 32 and the shield member 34 restrains the microwave flowing toward the support portion 33 through the insulating member 35 from leaking to the outer conductor 32 or the shield member 34. This allows the microwave to be readily supplied to the workpiece W.

In both the first process and the second process, bias voltage is applied to the workpiece W via the center conductor 31. At this time, prevention of electrical connection of the center conductor 31 with the outer conductor 32 or the shield member 34 restrains the potential difference between the workpiece W and the ground from being reduced. As a result, a metal film is properly formed on the workpiece W in the first process. Also, a diamond-like carbon film is properly formed on the workpiece W in the second process.

The insulating member 35 has an exit surface, which is a surface for emitting microwaves from inside to the outside. When the exit surface is orthogonal to the specified direction X, in which the center conductor 31 extends, the microwave flowing toward the support portion 33 through the insulating member 35 reaches the metal film formed on the exit surface substantially at an right angle. The closer to the right angle the angle of incidence of the microwave to the metal film, the more likely it becomes that the metal film returns the microwave to the opposite side of the support portion 33 in the specified direction X (downward as viewed in FIG. 2).

In this regard, in this embodiment, the distal surface 381 of the protruding portion 36 functions as the exit surface, and the distal surface 381 is formed to approach the center conductor 31 toward the support portion 33 in the specified direction X. Thus, the angle of incident of the microwave to the metal film formed on the distal surface 381 is not a right angle. This restrains the microwave from being returned to the opposite side of the support portion 33 in the specified direction X by the metal film. This allows the microwave to be readily supplied to the workpiece W.

Further, since the distal surface 381 of the protruding portion 36 has the above-described shape, the microwave flowing through the insulating member 35 is reflected toward the radial center by the metal film formed on the distal surface 381. This allows the microwave that has passed through the metal film to be readily supplied to the workpiece W in the chamber 11.

The above illustrated embodiment may be modified as follows.

In the above illustrated embodiment, the distal end 34e of the shield member 34 is slightly closer to the support portion 33 in the specified direction X than the distal end 36e of the protruding portion 36. However, as long as adhesion of metal to the outer circumferential surface 322 of the outer conductor 32 is restrained by the shield member 34, the distal end 34e of the shield member 34 may be arranged to be farther from the support portion 33 in the specified direction X than the distal end 36e of the protruding portion 36. For example, the distal end 34e of the shield member 34 may be arranged at the same position as the boundary portion 39 in the defined direction X. Alternatively, the distal end 34e of the shield member 34 may be arranged between the boundary portion 39 and the distal end 32e of the outer conductor 32 in the specified direction X.

The shield member 34 may be made of an insulating material. In this case, even if the center conductor 31 is connected to the shield member 34 by the metal adhered to the high-frequency wave supplying structure 30, the center conductor 31 is restrained from being grounded. In this case, it is not necessary to insulate the outer circumferential surface 322 of the outer conductor 32, which is opposed to the inner circumferential surface 341 of the shield member 34.

Further, if the shield member 34 is made of an insulating material, the outer diameter of the proximal section 37 of the protruding portion 36 may be made equal to the inner diameter of the shield member 34, and the proximal surface 371 of the protruding portion 36 may be brought into contact with the inner circumferential surface 341 of the shield member 34.

Figure 3:
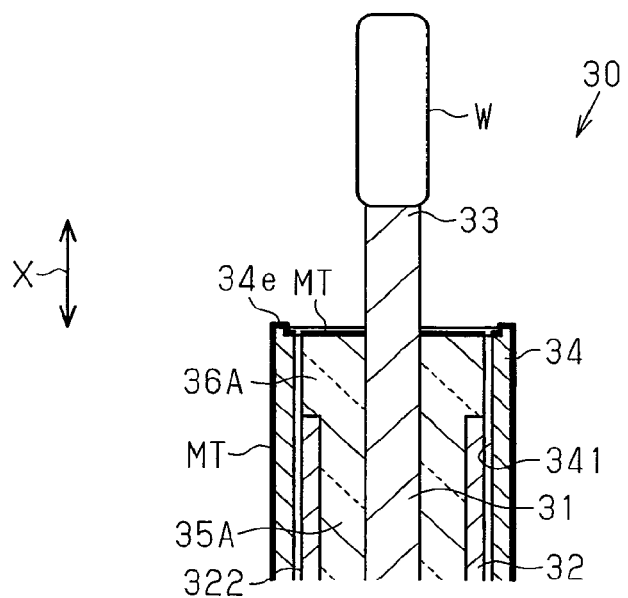
FIG. 3 is a cross-sectional view showing a state in which metal has adhered to a high-frequency wave supplying structure according to another embodiment.

The protruding portion 36 of the insulating member 35 may have no section that corresponds to the distal section 38 in the above embodiment. That is, the protruding portion 36 does not necessarily have a section in which the outer diameter decreases toward the support portion 33 in the specified direction X. FIG. 3 shows an example of a high-frequency wave supplying structure 30 including such an insulating member 35A. In this configuration also, a protruding portion 36A of the insulating member 35A and the shield member 34 restrains metal MT from adhering to the outer conductor 32, thereby restraining the center conductor 31 from being electrically connected to the outer conductor 32.

Figure 4:
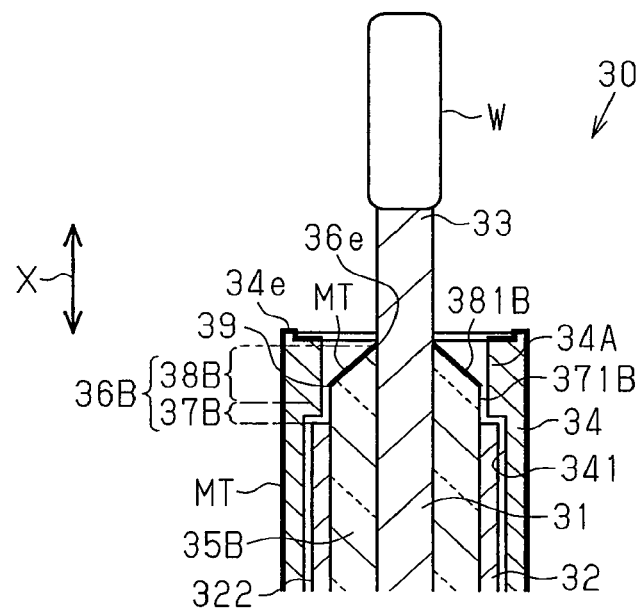
FIG. 4 is a cross-sectional view showing a state in which metal has adhered to a high-frequency wave supplying structure according to another embodiment.

As shown in FIG. 4, part of the shield member 34 may be brought closer to the support portion 33 in the specified direction X than the outer conductor 32. For example, the portion of the shield member 34 that is closer to the support portion 33 in the specified direction X than the outer conductor 32 is defined as a specified section 34A. In this case, the inner diameter of the specified section 34A is smaller than the outer diameter of the outer conductor 32. As shown in FIG. 4, a protruding portion 36B of an insulating member 35B has a proximal section 37B and a distal section 38B. The outer diameter of the proximal section 37B is equal to the inner diameter of the outer conductor 32. The distal section 38B is closer to the support portion 33 in the specified direction X than the proximal section 37B. The outer diameter of the distal section 38B decreases toward the support portion 33 in the specified direction X. In this case, the outer circumferential surface of the proximal section 37B is a proximal surface 371B, and the outer circumferential surface of the distal section 38B is a distal surface 381B. In this configuration also, the protruding portion 36B and the shield member 34 restrains metal MT from adhering to the outer conductor 32, thereby restraining the center conductor 31 from being electrically connected to the outer conductor 32.

Figure 5:
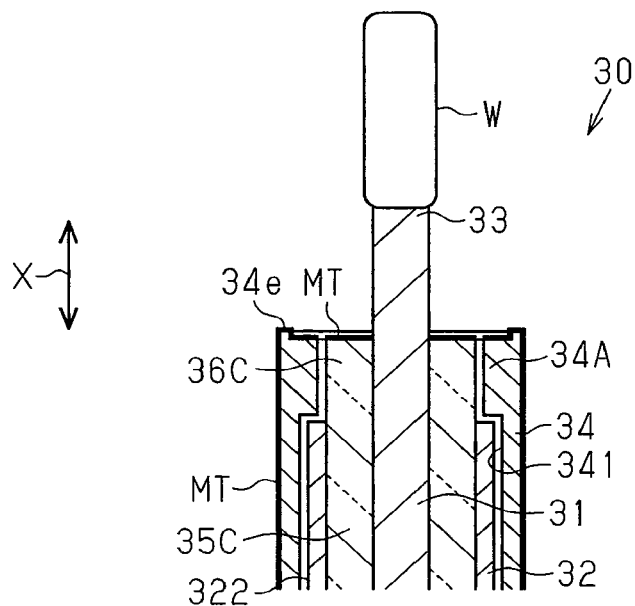
FIG. 5 is a cross-sectional view showing a state in which metal has adhered to a high-frequency wave supplying structure according to another embodiment.

FIG. 5 shows a modification of the embodiment shown in FIG. 3. That is, in the modification of FIG. 5, the section that corresponds to the distal section 38 in the above illustrated embodiment is not provided in the protruding portion. Even in this case, as shown in FIG. 5, the inner diameter of the specified section 34A of the shield member 34 may be smaller than the outer diameter of the outer conductor 32. In this configuration also, a protruding portion 36C of the insulating member 35C and the shield member 34 restrains metal MT from adhering to the outer conductor 32, thereby restraining the center conductor 31 from being electrically connected to the outer conductor 32.

If the inner diameter of the specified section 34A is smaller than the inner diameter of the outer conductor 32, the outer diameter of the protruding portion 36C may be set smaller than the inner diameter of the outer conductor 32 as long as the gap between the outer circumferential surface of the protruding portion 36C and the inner circumferential surface 341 of the shield member 34 is not widened.

Figure 6:
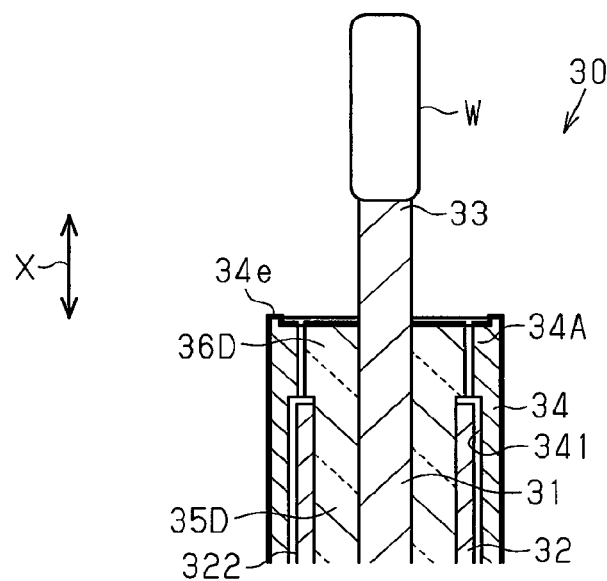
FIG. 6 is a cross-sectional view showing a state in which metal has adhered to a high-frequency wave supplying structure according to another embodiment.
Figure 7:
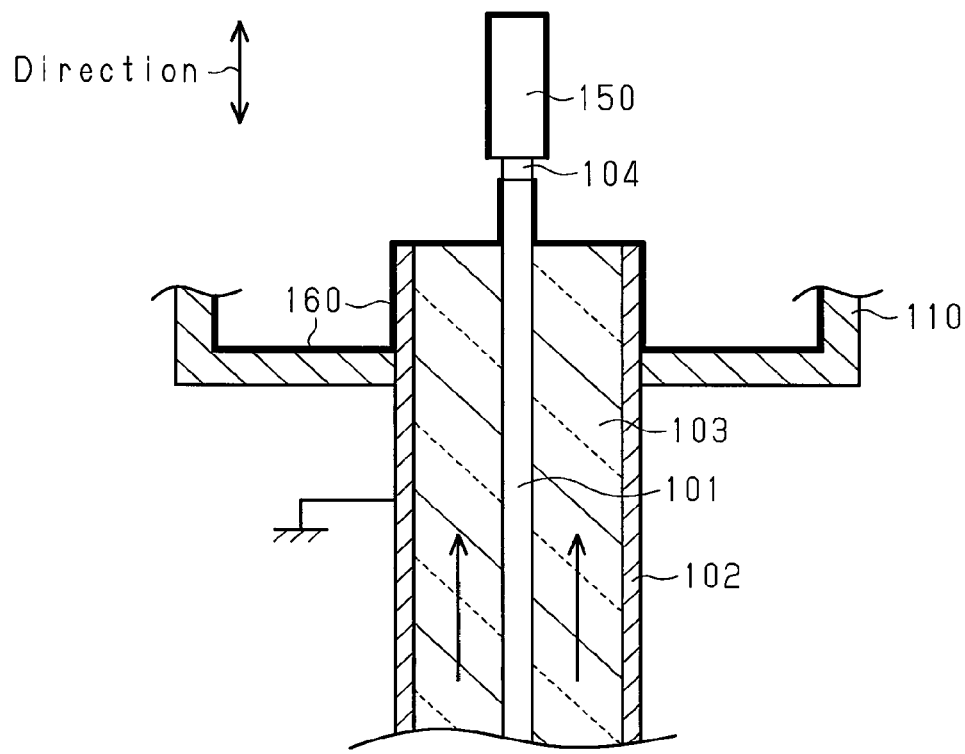
FIG. 7 is a cross-sectional view showing a state in which metal has adhered to a conventional high-frequency wave supplying structure.

If the inner diameter of the specified section 34A is smaller than the outer diameter of the outer conductor 32 and larger than the inner diameter of the outer conductor 32 as shown in FIG. 6, the outer diameter of a protruding portion 36D of an insulating member 35D may be set larger than the inner diameter of the outer conductor 32 and smaller than the outer diameter of the outer conductor 32. In this case, both the protruding portion 36D and the specified section 34A are opposed to the distal end 32e of the outer conductor 32 in the specified direction X. In this configuration also, the protruding portion 36D and the shield member 34 restrains metal MT from adhering to the outer conductor 32, thereby restraining the center conductor 31 from being electrically connected to the outer conductor 32.

The center conductor may include an elongated member extending in the specified direction and a support member that is provided at the distal end of the elongated member and supports the workpiece W. In this case, the support member functions as the support portion 33.

The high-frequency wave supplied to the workpiece W by the high-frequency wave supplying structure may be any high-frequency wave as long as that high-frequency wave can perform some treatment on the workpiece W. For example, the high-frequency wave may be an RF (13.56 MHz) wave, which is different in frequency from the microwave. The RF stands for radio frequency.

The second process, in which a high-frequency wave such as a microwave is used, does not necessarily need to a process for forming a film on the surface of the workpiece W, but may be a process of etching the surface of the workpiece W.

An apparatus other than the apparatus that generates arc discharge in the chamber 11 may be employed as the apparatus for forming a metal film on the workpiece W. Such an apparatus may be, for example, an apparatus that heats the evaporation source to evaporate some of the evaporation source and cause the evaporated metal to adhere to the workpiece W.

Therefore, the present examples and embodiments are to be considered as illustrative and not restrictive and the invention is not to be limited to the details given herein, but may be modified within the scope and equivalence of the appended claims.

The invention claimed is:

1. A high-frequency wave supplying structure employed in a film forming apparatus that performs, in a single chamber, a process of forming a metal film on a workpiece and a process using a high-frequency wave on a workpiece, the structure comprising:
 a center conductor that extends in a specified direction and to which a high-frequency wave is supplied;
 an outer conductor that is located outward of the center conductor, coaxial with the center conductor, and grounded; and
 a cylindrical insulating member that is provided between the center conductor and the outer conductor, wherein
 the center conductor includes a distal end that protrudes in the specified direction from an opening of the outer conductor,
 the distal end of the center conductor is a support portion that supports the workpiece,
 a tubular shield member is arranged outward of the outer conductor to be coaxial with the outer conductor and the center conductor,
 the shield member includes a distal end that is located at an end in a vicinity of the support portion in the specified direction,
 the outer conductor includes a distal end that is located at an end in a vicinity of the support portion in the specified direction,
 the distal end of the shield member is closer to the support portion in the specified direction than the distal end of the outer conductor,
 the insulating member includes a protruding portion that protrudes in the specified direction toward the support portion from the opening of the outer conductor, and
 at least one of the protruding portion and the shield member is opposed to the distal end of the outer conductor in the specified direction.

2. The high-frequency wave supplying structure according to claim 1, wherein
 the insulating member includes an outer circumferential surface in the protruding portion,
 the outer circumferential surface of the protruding portion includes
  a proximal surface, and
  a distal surface that is closer to the support portion than the proximal surface in the specified direction, and
 the distal surface of the insulating member is configured to approach the center conductor toward the support portion in the specified direction.

3. The high-frequency wave supplying structure according to claim 2, wherein
 the insulating member includes, in the protruding portion,
  a proximal section, and
  a distal section that is closer to the support portion than the proximal section in the specified direction,
 the proximal section has an outer diameter that is constant irrespective of the position in the specified direction,
 the distal section has an outer diameter that decreases toward the support portion in the specified direction,
 the proximal section has an outer circumferential surface that serves as the proximal surface, and
 the distal section has an outer circumferential surface that serves as the distal surface.

4. The high-frequency wave supplying structure according to claim 2, wherein a position of the distal end of the shield member in the specified direction is closer to the support portion than a boundary portion between the proximal surface and the distal surface in the protruding portion of the insulating member.

5. The high-frequency wave supplying structure according to claim 1, wherein
 the shield member has an inner diameter that is larger an outer diameter of the outer conductor, and
 the shield member is not grounded.

6. The high-frequency wave supplying structure according to claim 1, wherein the shield member is made of an insulating material.

* * * * *